(12) United States Patent
Nojiri et al.

(10) Patent No.: US 9,013,912 B2
(45) Date of Patent: Apr. 21, 2015

(54) NONVOLATILE SEMICONDUCTOR MEMORY DEVICE AND METHOD OF FORMING SAME

(71) Applicant: Kabushiki Kaisha Toshiba, Tokyo (JP)

(72) Inventors: Yasuhiro Nojiri, Yokohama (JP);
Shigeki Kobayashi, Kuwana (JP);
Masaki Yamato, Yokkaichi (JP);
Hiroyuki Fukumizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/845,668

(22) Filed: Mar. 18, 2013

(65) Prior Publication Data

US 2014/0063911 A1 Mar. 6, 2014

Related U.S. Application Data

(60) Provisional application No. 61/695,568, filed on Aug. 31, 2012.

(30) Foreign Application Priority Data

Mar. 7, 2013 (JP) .................................. 2013-45037

(51) Int. Cl.
*G11C 11/4193* (2006.01)
*G11C 13/00* (2006.01)
(52) U.S. Cl.
CPC .................................. *G11C 13/0002* (2013.01)
(58) Field of Classification Search
USPC ........................................................ 365/148
See application file for complete search history.

(56) References Cited

U.S. PATENT DOCUMENTS

| 2011/0228587 A1 | 9/2011 | Ito |
| 2011/0235396 A1 | 9/2011 | Sasaki |
| 2012/0075913 A1* | 3/2012 | Kunitake et al. ............... 365/148 |

FOREIGN PATENT DOCUMENTS

| JP | 2010-282673 | 12/2010 |
| JP | 2011-60389 | 3/2011 |
| JP | 2011-198407 | 10/2011 |
| JP | 2011-198445 | 10/2011 |

\* cited by examiner

*Primary Examiner* — Hoai V Ho
*Assistant Examiner* — Jay Radke
(74) *Attorney, Agent, or Firm* — Oblon, McClelland, Maier & Neustadt, L.L.P.

(57) ABSTRACT

A nonvolatile semiconductor memory device according to an embodiment comprises: a memory cell array including a plurality of memory layers; and a control unit configured to control a voltage applied to the memory cell array. Each of the memory layers comprises a first line and a second line, and further includes a memory cell disposed between the first line and the second line and including a variable resistance element. The control unit is configured to, when executing a forming operation on the memory cell array, execute the forming operation sequentially on the plurality of memory layers. The forming operation is executed sequentially on the memory layers in ascending order of a magnitude of a non-selected current flowing in a non-selected memory cell during the forming operation.

10 Claims, 5 Drawing Sheets

NONVOLATILE SEMICONDUCTOR MEMORY DEVICE AND METHOD OF FORMING SAME

CROSS REFERENCE TO RELATED APPLICATIONS

This application is based on and claims the benefit of priority from prior Provisional U.S. Patent Application No. 61/695,568, filed on Aug. 31, 2012, the entire contents of which are incorporated herein by reference.

FIELD

Embodiments described in this specification relate to a nonvolatile semiconductor memory device and a method of forming the same.

BACKGROUND

Conventionally known and market-released semiconductor memory devices such as DRAM, SRAM, and flash memory have all used a MOSFET as a memory cell. Therefore, along with miniaturization of patterns, it has been required to improve dimensional accuracy at a rate exceeding the rate of miniaturization. As a result, a large burden has also been placed on lithography technology for forming these patterns, which has been a major cause of a rise in product costs.

In recent years, resistance varying memory has been receiving attention as a successor candidate of such semiconductor memory devices employing a MOSFET as a memory cell. Such a resistance varying memory has advantages that a cross-point type cell structure in which memory cells are formed at intersections of intersecting bit lines and word lines can be adopted, making miniaturization easy compared to conventional memory cells, and also a stacking structure can be configured in a longitudinal direction, making it easy to improve a degree of integration of a memory cell array.

A write operation (setting operation) of data to a resistance varying memory of so-called bipolar type is performed by applying to a variable resistance element a setting voltage of a first polarity. This causes the variable resistance element to change from a high-resistance state to a low-resistance state. On the other hand, an erase operation (resetting operation) of data is performed by applying to a variable resistance element in a low-resistance state after a setting operation a resetting voltage of a second polarity which is opposite to the first polarity applied during the setting operation. This causes the variable resistance element to change from a low-resistance state to a high-resistance state.

When performing this kind of setting operation or a forming operation (an operation to render a memory cell in a state of being transition-capable between a high-resistance state and a low-resistance state), it is important to suppress unwanted sneak currents. This is because if sneak currents are large, a required value of a forming voltage increases, whereby problems arise such as trouble occurring in the forming operation, power consumption increasing, and so on.

DETAILED DESCRIPTION

A nonvolatile semiconductor memory device according to this embodiment comprises: a memory cell array including a plurality of memory layers; and a control unit for controlling a voltage applied to the memory cell array. Each of the memory layers comprises a first line and a second line, and further includes a memory cell disposed between the first line and the second line and including a variable resistance element. The control unit is configured to, when executing a forming operation on the memory cell array, execute the forming operation sequentially on the memory layers in ascending order of a magnitude of a non-selected current flowing in a non-selected memory cell during the forming operation.

Next, embodiments of the present invention are described in detail with reference to the drawings.

First Embodiment

Figure 1:
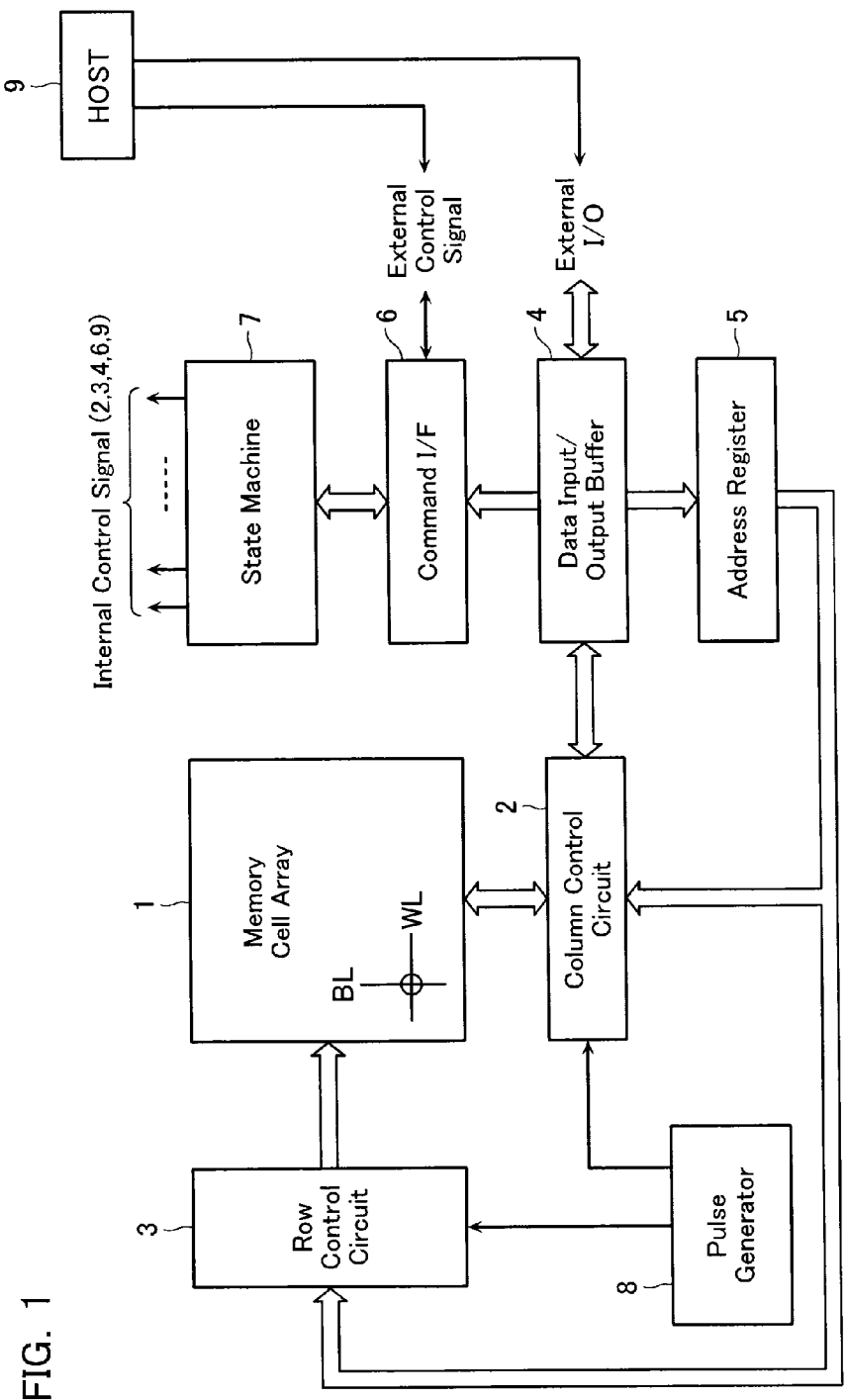
FIG. 1 is a block diagram of a nonvolatile semiconductor memory device according to an embodiment.

FIG. 1 is a block diagram of a nonvolatile memory according to a first embodiment.

This nonvolatile memory comprises a memory cell array 1 having memory cells arranged in a matrix therein, each of the memory cells utilizing a variable resistance element to be described later. The memory cell array 1 is configured having a plurality of memory layers stacked as mentioned later.

Provided at a position adjacent in a bit line BL direction of the memory cell array 1 is a column control circuit 2 that controls bit lines BL of the memory cell array 1 and applies voltages required in data erase of the memory cells, data write to the memory cells, and data read from the memory cells.

Moreover, provided at a position adjacent in a word line WL direction of the memory cell array 1 is a row control circuit 3 that selects word lines WL of the memory cell array 1 and applies voltages required in data erase of the memory cells, data write to the memory cells, and data read from the memory cells.

A data input/output buffer 4 is connected to an external host 9 via an I/O line to receive write data, receive erase commands, output read data, and receive address data and command data.

The data input/output buffer 4 sends the received write data to the column control circuit 2, and receives data read from the column control circuit 2 to be outputted to external. Addresses supplied to the data input/output buffer 4 from external are sent to the column control circuit 2 and the row control circuit 3 via an address register 5.

In addition, commands supplied to the data input/output buffer 4 from the host 9 are sent to a command interface 6. The command interface 6 receives external control signals from the host 9, judges whether data inputted to the data input/output buffer 4 is write data or a command or an address. If it is a command, it receives the data and transfers the data to a state machine 7 as a command signal.

The state machine 7 is a control circuit for performing management of this nonvolatile memory overall. The state machine 7 receives commands from the host 9 via the command interface 6, and performs read, write, erase, management of input/output of data, and so on. In addition, status information managed by the state machine 7 can also be received by the external host 9, whereby the external host 9 can judge an operation result. Moreover, this status information is utilized also in control of write and erase. Furthermore, the state machine 7 controls a pulse generator 8. This control enables the pulse generator 8 to output a pulse of any voltage and any timing.

The state machine 7 executes a forming operation on the memory cell array 1. In this case, the state machine 7 executes the forming operation sequentially on the plurality of memory layers. The forming operation is executed sequentially on the memory layers in ascending order of a magnitude of a non-selected current flowing in a non-selected memory cell during the forming operation. This will be described in detail later.

The pulse formed by the pulse generator 8 can be transferred to any line selected by the column control circuit 2 and the row control circuit 3. Note that elements of peripheral circuits other than the memory cell array 1 can be formed in a Si substrate directly below the memory cell array 1 formed in a wiring layer, whereby chip area of this nonvolatile memory can be made substantially equal to area of the memory cell array 1.

Figure 2:
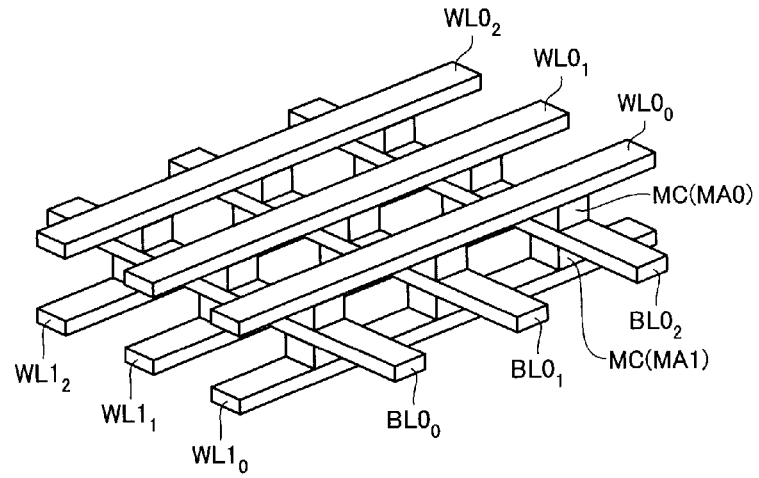
FIG. 2 is a perspective view of part of a memory cell array 1.
Figure 3:
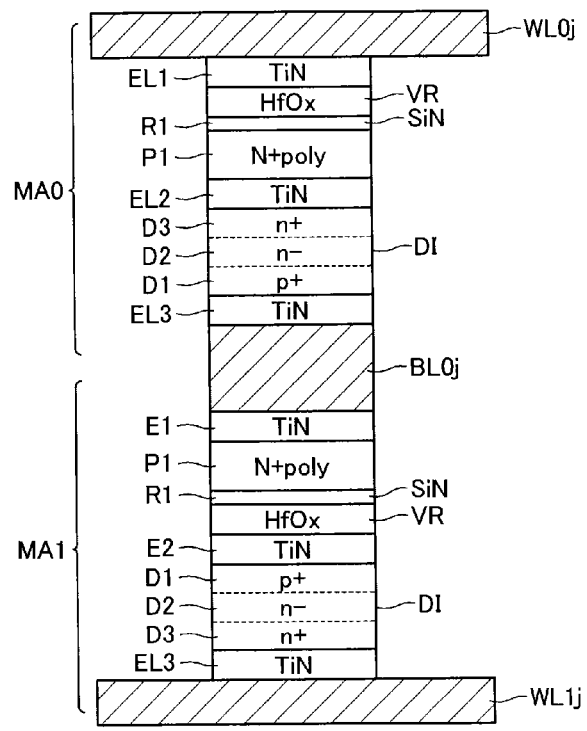
FIG. 3 is a cross-sectional view showing a structure of a single memory cell.

FIG. 2 is a perspective view of part of the memory cell array 1, and FIG. 3 is a cross-sectional view of a single one of the memory cells in FIG. 2. The memory cell array 1 in this example comprises as an example two memory layers MA0 and MA1. However, the present embodiment is not limited to this example, and extends also to a memory cell array comprising three or more layers of memory layers.

In this memory cell array 1 in FIG. 2, word lines WL$0_0$~WL$0_2$ and WL$1_0$~WL$1_2$ acting as a plurality of first lines are arranged in parallel, and bit lines BL$0_0$~BL$0_2$ acting as a plurality of second lines are arranged in parallel intersecting these word lines WL$0_0$~WL$0_2$ and WL$1_0$~WL$1_2$. Memory cells MC are each disposed to be sandwiched at each of intersections of these word lines and bit lines. A plurality of the memory cells MC are disposed in a matrix at intersections of the word lines WL$0_0$~WL$0_2$ and the bit lines BL$0_0$~BL$0_2$ to form the memory layer MA0. Moreover, a plurality of the memory cells MC are disposed in a matrix at intersections of the word lines WL$1_0$~WL$1_2$ and the bit lines BL$0_0$~BL$0_2$ to form the memory layer MA1. The memory layers MA0 and MA1 are formed in a stacking direction (up-and-down direction) and share the bit lines BL0. It is also possible for the word lines WL to be shared instead of the bit lines BL being shared. Note that the bit lines BL and the word lines WL are desirably of a material that is heat resistant and has a low resistance value. For example, the likes of W, WSi, NiSi, and CoSi can be employed as the material. Here, the case where W is employed is described as an example.

As shown in FIG. 3, the memory cell MC is configured from a series-connected circuit of a variable resistance element VR and a diode D1 (bidirectional diode). As shown in FIG. 3, the diode D1 is configured from a PIN diode comprising a p+ type layer D1, an n− type layer D2, and an n+ type layer D3, as an example. Here, the symbols "+" and "−" indicate magnitude of impurity concentration. In this example in FIG. 3, the diode D1 is formed having a direction from the bit line BL toward the word line WL as a forward direction. That is, polarity of the diodes in the memory layer MA0 is in a reverse direction with respect to the memory layers MA1.

The variable resistance element VR is configured from for example a thin film of an oxide of a transition metal (for example, hafnium oxide (HfOx)). Besides employing hafnium oxide, it is also possible to employ oxides of other transition metals (chromium (Cr), tungsten (W), vanadium (V), niobium (Nb), tantalum (Ta), titanium (Ti), zirconium (Zr), scandium (Sc), yttrium (Y), thorium (Tr), cobalt (Co), nickel (Ni), copper (Cu), zinc (Zn), cadmium (Cd), aluminum (Al), gallium (Ga), tin (Sn), lead (Pb), antimony (Sb), and bismuth (Bi)). Moreover, oxides of rare earth elements from lanthanum (La) to lutetium (Lu) may also be employed. However, when hafnium oxide is adopted as the material of the variable resistance element VR, values of a forming voltage Vform or a setting voltage Vset can be reduced compared to when for example titanium oxide (TiOx) or aluminum oxide (Al2O3) is employed as the material of the variable resistance element VR. Moreover, if nitrogen (N) is included in the hafnium oxide, values of the forming voltage Vform or the setting voltage Vset can be further reduced.

The memory layers MA0 and MA1 both comprise the variable resistance element VR and the diode D1, as well as similar electrodes and so on, but have orders of stacking that differ from each other.

In the memory layer MA1, a first electrode EL1, an N+ type polysilicon layer P1, and a silicon nitride film R1 (SiN layer) are formed between the variable resistance element VR and the bit line BL$0j$, sequentially from above. Moreover, a second electrode EL2 and a third electrode EL3 are formed on upper and lower surfaces of the diode D1. The first electrode EL1, the second electrode EL2, and the third electrode EL3 are formed from for example titanium nitride (TiN).

On the other hand, in the memory layer MA0, the first electrode EL1 is formed between the variable resistance element VR and the word line WL$0j$. Moreover, the silicon nitride film R1, the N+ type polysilicon layer P1, and the second electrode EL2 are formed between the diode D1 and the variable resistance element VR, sequentially from above. The third electrode EL3 is formed between the diode D1 and the bit line BL$0j$. Having the stacking structure differ between the memory layers MA0 and MA1 in this way is in order to uniformize characteristics of memory cells between the layers. Note that the structure in FIG. 3 is merely one example. When three or more memory layers are formed, it is preferable that at least adjacent memory layers have stacking structures that differ from each other.

The inventors in the present application focused on the problems that when performing the forming operation in the nonvolatile semiconductor memory device having the above-described structure, there is a large variation in time to completion of the forming operation between a plurality of memory chips and there is also a large variation in power consumption between a plurality of memory chips. Moreover, the inventors proceeded with research to achieve solutions to these problems. As a result, the inventors found out that when the stacking structure of a stacked plurality of memory layers differs, electrical resistance characteristics tend to differ greatly between the plurality of memory layers in a state prior to the forming operation. The reason why electrical resistance differs greatly is assumed to arise from differences in stacking order in the plurality of memory layers.

Accordingly, the inventors in the present application, when executing the forming operation sequentially in a plurality of memory layers, executed the forming operation sequentially on the memory layers in ascending order of a magnitude of a non-selected current flowing in a non-selected memory cell during the forming operation. As a result, the time to completion of the forming operation was shortened and the non-selected current and the forming voltage required in the forming operation could also be reduced, thereby enabling power consumption to be reduced. A memory cell having a large non-selected current is a memory cell having a low electrical resistance, hence it could also be said that the present embodiment performs the forming operation sequentially from the memory layer having a large electrical resistance.

Figure 4:
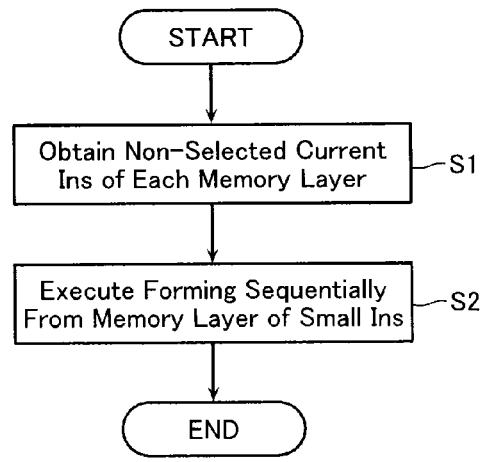
FIG. 4 is a flowchart showing a sequence of a forming operation in the nonvolatile semiconductor memory device according to the embodiment.
Figure 5:
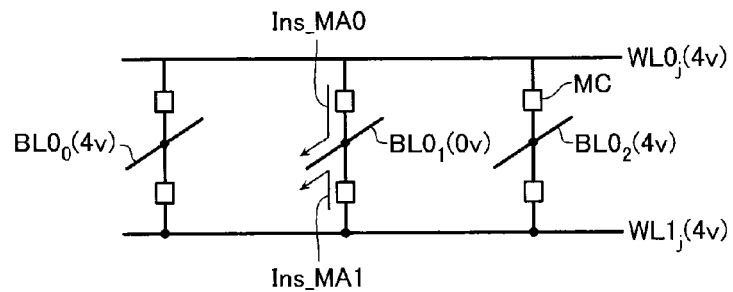
FIG. 5 shows an operation in step S1 of the flowchart in FIG. 4.
Figure 5:
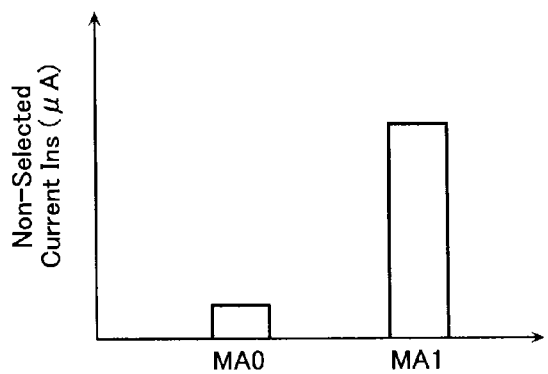

A sequence of the forming operation in the present embodiment is shown in FIG. 4. First, data of the non-selected current Ins in each of the plurality of memory layers MA is obtained by simulation or another method (S1). As shown in FIG. 5, for example, the simulation assumes a memory cell array having a structure identical to those of memory layers MA0 and MA1. Note that this simulation is conducted by inserting a silicon oxide layer (SiO2) to either a variable resistance element of the memory layer MA0 or that of the memory layer MA1. This may calculate the non-selected current Ins flowing only in the non-selected memory cell of either the memory layer MA0 or MA1. When data of the non-selected current Ins in each of the memory layers has been obtained, the state machine 7 stores this data in a storage unit not shown. The state machine 7 executes the forming operation sequentially from the memory array MA having a small non-selected current Ins, based on this data of the non-selected current Ins (S2).

As an example, as shown in FIG. 5, in the case of a memory cell array having the structure of the kind shown in FIG. 3, the non-selected current Ins in the memory layer MA0 is found to be small compared to the non-selected current Ins in the memory layer MA1. In this case, in the present embodiment, the forming operation is first executed on the memory layer MA0, then, after completion of the forming operation to that memory layer MA0, the forming operation on the memory layer MA1 is executed. This allows the forming voltage Vform to be reduced and enables the non-selected current Ins overall to be suppressed.

Figure 6:
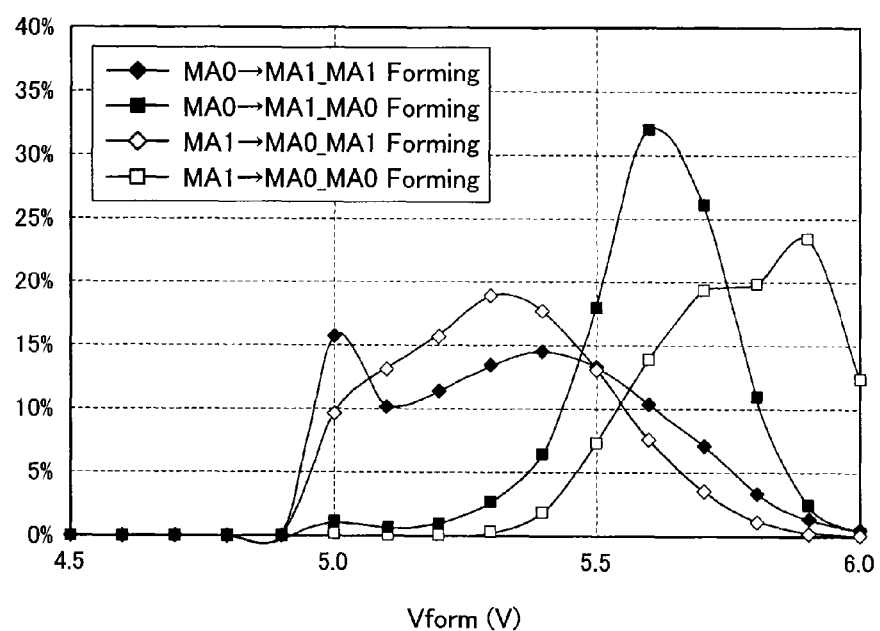
FIG. 6 is a graph showing a relationship between the sequence of the forming operation and a forming voltage.

FIG. 6 is a graph showing the forming voltage Vform when the forming operation is first performed on the memory layer MA0 and then is performed on the memory layer MA1, in the memory cell array 1 of FIG. 3. For comparison, FIG. 6 also shows the forming voltage Vform when contrarily the forming operation is first performed on the memory layer MA1 and then is performed on the memory layer MA0.

In the former case, the forming voltage in the memory layer MA0 first undergoing the operation has a narrow peak in distribution width at around 5.6 V, and the memory layer MA1 later undergoing the operation has a broad peak in distribution width at around 5.4 V. In contrast, in the latter case, the memory layer MA1 first undergoing the operation has a broad peak in distribution width at a similar voltage to the former case of around 5.4 V, but the memory layer MA0 later undergoing the operation has a broad peak in distribution width at a different voltage to the former case of around 5.9 V. As this makes clear, in the memory layer MA0 having a high resistance, the order of the forming operation gives rise to a difference in the forming voltage.

Figure 7A:
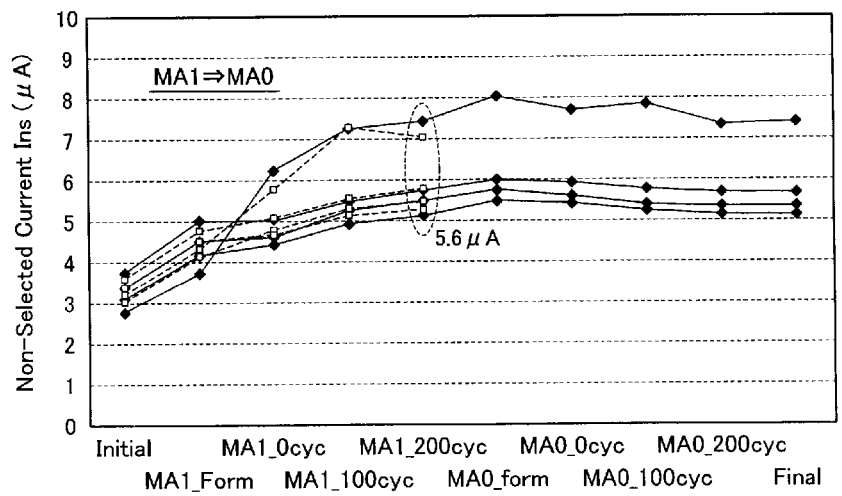
FIGS. 7A and 7B are graphs showing a relationship between the sequence of the forming operation and a non-selected current Ins flowing during the forming operation.

FIG. 7A is a graph showing shifts in the non-selected current Ins between start and completion of the forming operation when the forming operation is first performed on the memory layer MA1 and then is performed on the memory layer MA0. In this case, the non-selected current Ins is about 3.4 μA immediately after start of the forming operation on the memory layer MA1, but as the number of times of executions of the forming operation, write operation, and erase operation on the memory layer MA1 increases, the non-selected current Ins gradually increases, and increases to about 5.6 μA at around when 200 times of write/erase operations on the memory layer MA1 are completed. This is because forming and write/erase operations cause the memory cells to undergo a lowering of resistance and attain a state where it is easy for current to flow. Then, forming and write/erase operations on the memory layer MA0 having a high resistance are performed, under which a value of the non-selected current Ins hardly changes.

Figure 7B:
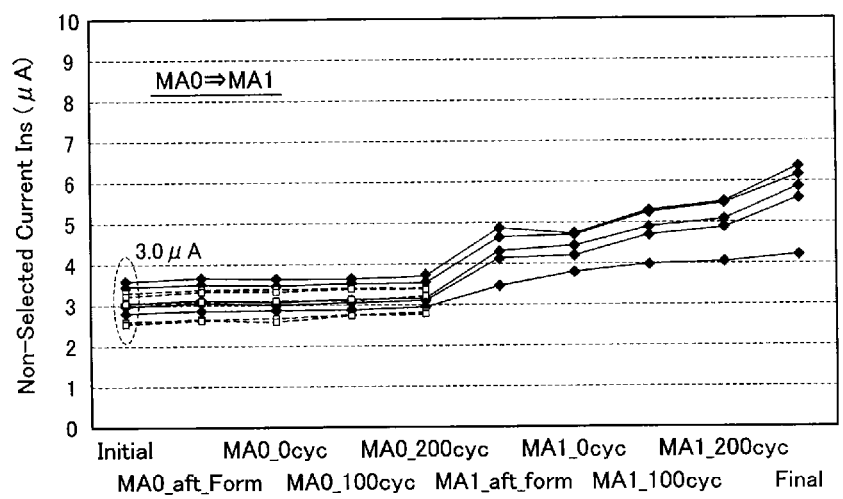

FIG. 7B is a graph showing shifts in the non-selected current Ins between start and completion of the forming operation when the forming operation is first performed on the memory layer MA0 and then is performed on the memory layer MA1. In this case, contrarily to the case of FIG. 7A, the non-selected current Ins hardly changes by the forming and about 200 times of write/erase operations on the memory layer MA0. Later, when the forming and write/erase operations on the memory layer MA1 start, the non-selected current Ins gradually rises, and immediately before the forming operation on the memory layer MA1 is completed, reaches about 5.5 μA. This value is almost the same as the former case.

Comparing the non-selected current Ins and the forming voltage immediately before the forming operation of the memory layer MA0 in the former and latter cases, these are 5.6 μA and 5.9 V in the former case and 3.0 μA and 5.6 V in the latter case. When the non-selected current is large, the voltage applied to memory cells during the forming operation falls, which resultantly triggers a rise in the forming voltage.

Starting the forming operation sequentially from the memory layer MA in which the magnitude of the non-selected current Ins during the forming operation is small (MA0 in FIG. 3) in this way enables effects of the non-selected current Ins to be suppressed to a minimum, enables the forming voltage Vform to be lowered with the result that power consumption required in the forming operation can be suppressed, and enables time required for the forming operation to be shortened.

To simplify explanation, FIGS. 1-5 described an example of the nonvolatile semiconductor memory device having two memory layers. However, the present invention is not limited to this example and may be applied also to a nonvolatile semiconductor memory device having n layers of memory layers (n>=2).

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A nonvolatile semiconductor memory device, comprising:
 a substrate;
 a memory cell array including a plurality of memory layers formed on a surface of the substrate, the plurality of layers being stacked in a stacking direction perpendicular to the surface; and
 a control unit configured to control a voltage applied to the memory cell array, each of the memory layers including a first line, a second line, and a memory cell which is disposed between the first line and the second line and includes a variable resistance element, the control unit being configured to, when executing a forming operation on the memory cell array, execute the forming operation sequentially on the plurality of memory layers, the forming operation being executed sequentially on the memory layers in ascending order of a magnitude of a non-selected current flowing in a non-selected memory cell during the forming operation.

2. The nonvolatile semiconductor memory device according to claim 1, wherein among the plurality of memory layers, at least memory layers adjacent to each other have stacking structures that differ from each other.

3. The nonvolatile semiconductor memory device according to claim 1, wherein two of the memory layers adjacent in the stacking direction share the first line or the second line.

4. The nonvolatile semiconductor memory device according to claim 3, wherein one of the two memory layers adjacent in the stacking direction includes a diode having a first direction as a forward direction, and the other of the two memory layers adjacent in the stacking direction includes a diode having a second direction as a forward direction, the second direction being an opposite direction to the first direction.

5. The nonvolatile semiconductor memory device according to claim 3, wherein among the plurality of memory layers, at least memory layers adjacent to each other have stacking structures that differ from each other.

6. A method of executing a forming operation in a nonvolatile semiconductor memory device, the nonvolatile semiconductor memory device including a substrate, a memory cell array that includes a plurality of memory layers formed on a surface of the substrate, the plurality of layers being stacked in a stacking direction perpendicular to the surface and each of the memory layers including a first line, a second line, and a memory cell which is disposed between the first line and the second line and includes a variable resistance element, the method comprising:

when the forming operation is executed, obtaining data related to a magnitude of a non-selected current flowing in each of the plurality of memory layers; and executing the forming operation sequentially on the memory layers in ascending order of a magnitude of a non-selected current flowing in a non-selected memory cell during the forming operation.

7. The method according to claim 6, wherein among the plurality of memory layers, at least memory layers adjacent to each other have stacking structures that differ from each other.

8. The method according to claim 6, wherein two of the memory layers adjacent in the stacking direction share the first line or the second line.

9. The method according to claim 8, wherein one of the two memory layers adjacent in the stacking direction includes a diode having a first direction as a forward direction, and the other of the two memory layers adjacent in the stacking direction includes a diode having a second direction as a forward direction, the second direction being an opposite direction to the first direction.

10. The method according to claim 8, wherein among the plurality of memory layers, at least memory layers adjacent to each other have stacking structures that differ from each other.

* * * * *